(12) United States Patent
Boggs et al.

(10) Patent No.: US 7,385,288 B2
(45) Date of Patent: Jun. 10, 2008

(54) ELECTRONIC PACKAGING USING CONDUCTIVE INTERPROSER CONNECTOR

(75) Inventors: David W. Boggs, Hillsboro, OR (US); John H. Dungan, Hillsboro, OR (US); Frank A. Sanders, Beaverton, OR (US); Daryl A. Sato, Portland, OR (US); Dan Willis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/761,315

(22) Filed: Jun. 11, 2007

(65) Prior Publication Data

US 2007/0228562 A1    Oct. 4, 2007

Related U.S. Application Data

(62) Division of application No. 10/835,675, filed on Apr. 30, 2004, now Pat. No. 7,241,680.

(51) Int. Cl.
| | |
|---|---|
| H01L 23/48 | (2006.01) |
| H01L 23/52 | (2006.01) |
| H01L 29/40 | (2006.01) |
| H01L 23/14 | (2006.01) |

(52) U.S. Cl. .................. 257/737; 257/702; 257/778; 257/E23.021

(58) Field of Classification Search ............... 257/737, 257/702, 778, E23.021
See application file for complete search history.

(56) References Cited

U.S. PATENT DOCUMENTS

| | | | |
|---|---|---|---|
| 4,862,322 | A | 8/1989 | Bickford et al. |
| 5,801,441 | A | 9/1998 | DiStefano et al. |
| 5,886,413 | A | 3/1999 | Knott et al. |
| 6,177,732 | B1 | 1/2001 | Zu |
| 6,257,899 | B1 | 7/2001 | Walkup et al. |
| 6,469,908 | B2 | 10/2002 | Patel et al. |
| 6,528,892 | B2 | 3/2003 | Caletka et al. |
| 6,630,631 | B1 | 10/2003 | Dishongh et al. |
| 6,671,947 | B2 | 1/2004 | Bohr |
| 6,891,255 | B2 | 5/2005 | Smith et al. |
| 2002/0140096 | A1 | 10/2002 | Higgins, III |
| 2005/0003650 | A1* | 1/2005 | Ramanathan et al. ........ 438/614 |
| 2005/0035347 | A1* | 2/2005 | Khandros et al. .............. 257/48 |
| 2005/0133363 | A1 | 6/2005 | Hu et al. |

* cited by examiner

*Primary Examiner*—Nitin Parekh
(74) *Attorney, Agent, or Firm*—Schwabe, Williamson & Wyatt, P.C.

(57) ABSTRACT

Formation of a plurality of conductive connectors of an integrated circuit package is described. The conductive connectors made with a conductive elastomer material and formed using an interposer that includes a plurality of the conductive connectors linked together.

8 Claims, 7 Drawing Sheets

ELECTRONIC PACKAGING USING CONDUCTIVE INTERPROSER CONNECTOR

RELATED APPLICATION

The present application is a divisional of U.S. patent application Ser. No. 10/835,675, filed Apr. 30, 2004, and entitled "ELECTRONIC PACKAGING USING CONDUCTIVE INTERPOSER CONNECTOR," which is hereby incorporated by reference in its entirety.

BACKGROUND OF THE INVENTION

1. Field of the Invention

The present invention relates to, but is not limited to electronic devices, and in particular, to the field of electronic packaging.

2. Description of Related Art

In the field of integrated circuit technology, integrated circuit (IC) components such as microprocessors are typically assembled into packages that are physically and electrically coupled to a substrate such as a printed circuit board (PCB). The packages themselves normally comprise of one or more IC components and one or more substrates. Each of these components typically comprises of multiple electrical contacts or conductive pads that are used to couple with other components. For example, electronic packages will usually have multiple contact or conductive pads used to couple with, for example, the PCB substrate. In order to electrically couple these electronic package to the PCB substrate, the contact pads of the electronic packages are typically coupled to conductive connectors such as solder bumps, pins and spring clips, that are further electrically coupled to the PCB substrate.

BRIEF DESCRIPTION OF THE DRAWINGS

Embodiments of the present invention will be described referencing the accompanying drawings in which like references denote similar elements, and in which.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

The following description includes terms such as on, onto, over, top, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, novel conductive connectors and novel methods for properly placing or siting the conductive connectors onto a multi-contact component or between two multi-contact components are provided. For the embodiments, multi-contact components may be any electronic component having multiple electrical contacts or interfaces for input/output (I/O), ground and/or power supply paths. These include, for example, a flip-chip, an integrated circuit (IC) package such as a land grid array (LGA) package or a ball grid array (BGA) package, a printed circuit board (PCB) substrate, or any other IC or electronic components having multiple electrical contact points or interfaces. In various embodiments, an interposer that includes multiple conductive connectors may be employed to place a plurality of conductive conductors on a multi-contact component or between two multi-contact components. In various embodiments, the conductive interposer connectors are linked together by, for example, a carrier frame. In some embodiments, each of the conductive interposer connectors may be made of a conductive elastomer material to further assure that proper electrical coupling occurs between the two multi-contact components.

Figure 1:
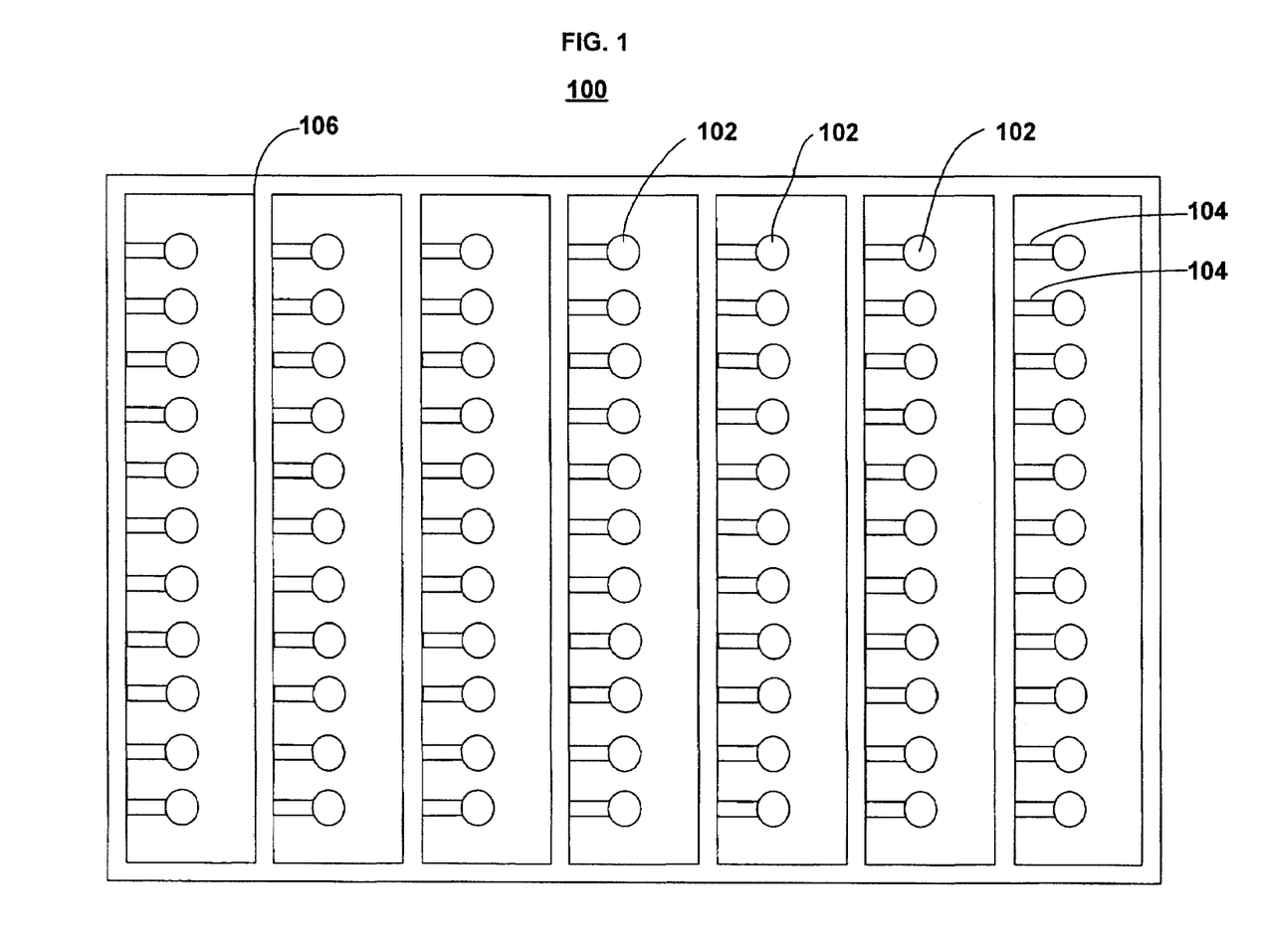
FIG. 1 illustrates a plan view of an interposer according to some embodiments.

Referring to FIG. 1, which depicts an interposer 100, which may be used to place a plurality of conductive buttons 102 between the electrical contacts of two multi-contact components according to various embodiments. For the embodiments, the interposer 100 includes multiple conductive buttons (i.e., conductive connectors) 102 that are attached to necks 104. The necks 104 may further be attached to a carrier frame 106. According to various embodiments, the carrier frame 106 may provide structural support to the conductive buttons 102 such that when the entire interposer 100 is moved or repositioned, each of the conductive buttons 102 may remain substantially stationary relative to the other conductive buttons. In various embodiments, the interposer 100 may be entirely made of a conductive material.

Note that conductive buttons 102 may also be referred to as conductive connectors. However, for ease of understanding, they will be primarily referred to as conductive buttons. Unless the context clearly indicates to the contrary, for the purpose of this description, usage of the two terms should be considered as synonymous. And the word "button" should not be read as inherently conveying any limitation on embodiments of the present invention.

Continuing to refer to FIG. 1, in some embodiments, the conductive material used to form the interposer 100 may be a conductive elastomer material. Examples of conductive elastomer materials that may be used for such purposes include, for example, conductive filled material such as carbon or silver filled materials. In some embodiments, only the conductive buttons 102 or the conductive buttons 102 and necks 104 may be made of the conductive elastomer material (see FIG. 6). Conductive buttons 102 made of such elastomer material may have elastic characteristics that may be desirable according to various embodiments. For example, when used to electrically couple two multi-contact components, these conductive elastomer buttons may assure that good electrical contact is maintained between the two multi-contact components.

Figure 2A:
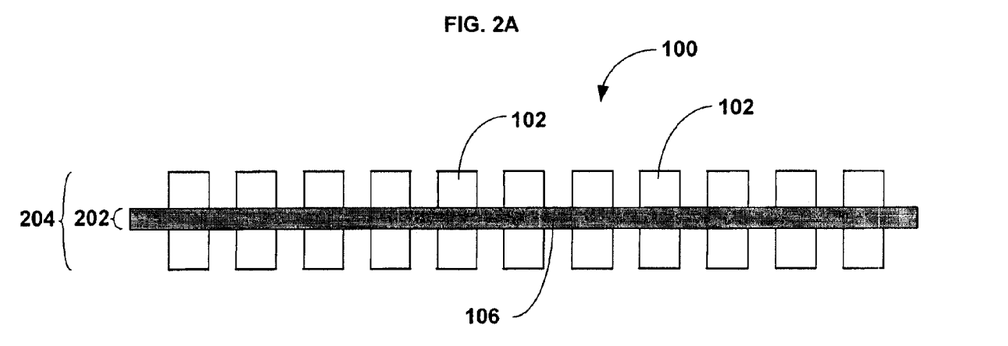
FIG. 2A illustrates a side view of the interposer of FIG. 1 according to some embodiments.
Figure 2B:
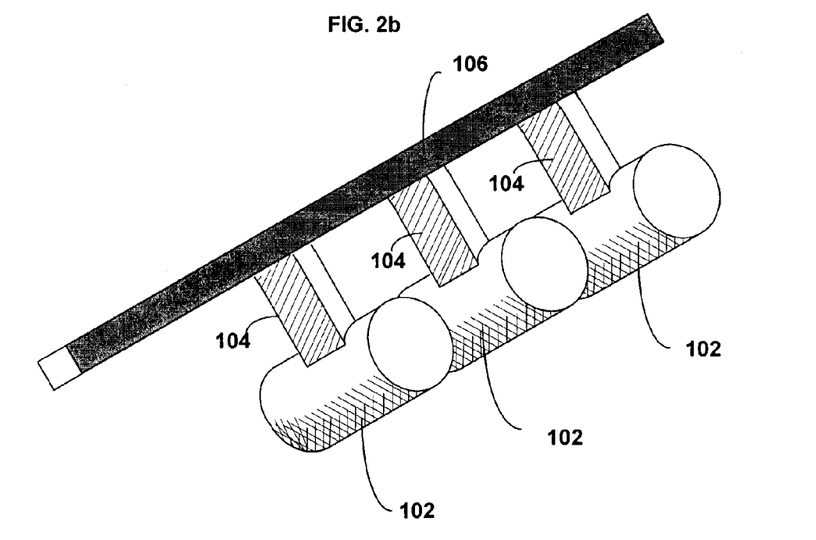
FIG. 2B illustrates a perspective view of three of the conductive connectors of the interposer of FIGS. 1 and 2B, in further detail, according to some embodiments.

FIG. 2A is a side view of the interposer 100 of FIG. 1 according to various embodiments. For these embodiments, the carrier frame 106 having a smaller thickness 202 than the thickness 204 of the conductive buttons 102. FIG. 2B is a close-up perspective view of three of the conductive buttons 102 of FIG. 2A according to some embodiments.

For these embodiments, the conductive buttons 102 having a cylindrical shape and attached to necks 104 that are in turn, attached to the carrier frame 106. In other embodiments, the conductive buttons 102 may be in the form of other shapes such as rectangular, square, and/or any other shapes that may be suitable for such purposes. According to various embodiments, the conductive buttons 102 may be used to electrically connect the electrical contacts of a multi-contact component to the electrical contacts of a second multi-contact component. That is, for these embodiments, each of the conductive buttons 102 may be used to form distinct I/O, ground and/or power supply paths between two multi-contact components.

The necks 104, which may be breakaway points, may be formed having breakaway features in accordance with various embodiments. For these embodiments, the necks 104 may have features, which may facilitate the separation of the conductive buttons 102 from the carrier frames 106. Such features may include, for example, necks 104 or portions of the necks 104 having a tapered diameter or forming the necks 104 made of material or materials that may be structurally weaker than the material or materials making up the carrier frame 106 and/or buttons 102. In other embodiments, having necks 104 with smaller diameters than the diameters of the carrier frame 106 and/or buttons 102 may by itself be sufficient in forming breakaway necks. Note that in alternative embodiments, the interposer 100 may not include necks 104. That is, for these embodiments, the buttons 102 may be directly attached to the carrier frame 106. In various embodiments, the carrier frame 106 may have certain structural characteristics that facilitate, for example, the proper placement of each of the multiple conductive buttons 102 onto electrical contacts on a multi-contact component or proper placement between pairs of corresponding electrical contacts on two multi-contact components. According to various embodiments, the electrical contacts may be electrical interfaces, such as the conductive or contact pads of a die, IC package, a PCB substrate, and the like. Each of the electrical contacts may be associated with a distinct I/O, ground and/or power supply path. In order to assure that the conductive buttons 102 are each properly placed or sited on different electrical contacts of a multi-contact component or properly placed between corresponding electrical contacts of two multi-contact components, the carrier frame 106 may have sufficient structural integrity to assure that each of the conductive buttons 102 attached to the carrier frame 106 remains substantially stationary relative to the other attached conductive connectors.

The interposer 100 may be formed using, for example, injection molding according to various embodiments. In one embodiment, the injection molding may be a two-shot die molding process, which may allow certain parts (e.g., buttons) of the interposer 100 to be made of conductive material while allowing other parts (e.g., carrier frame) to be made of nonconductive material.

Figure 3:
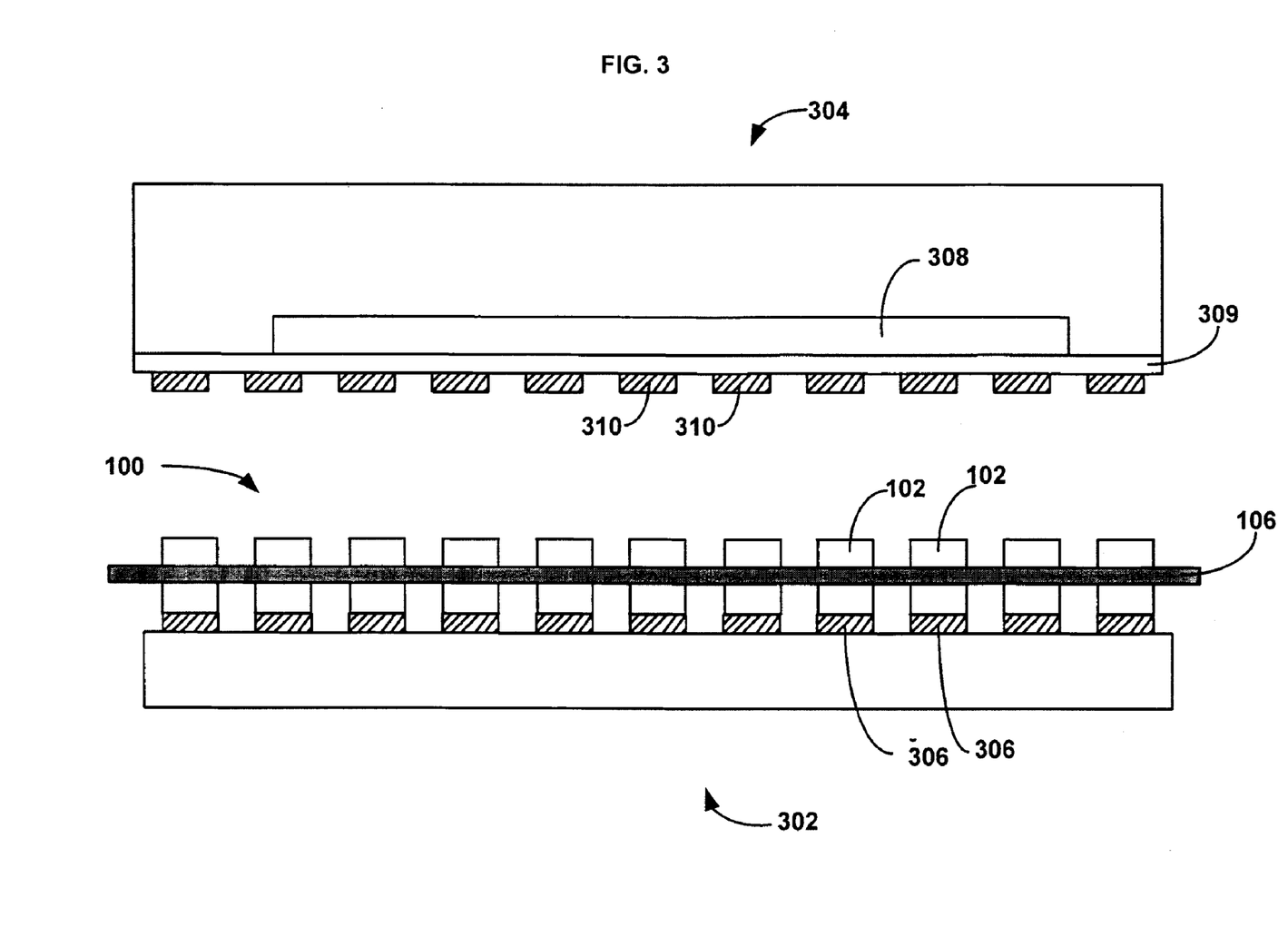
FIG. 3 illustrates a side view of the interposer of FIGS. 1 and 2A placed between a first and second multi-contact components according to some embodiments.

FIG. 3 depicts the interposer 100 of FIG. 1 placed between two multi-contact components, a package and a substrate, in accordance with some embodiments. For the embodiments, the substrate 302, such as a PCB substrate, comprises of multiple contact pads (i.e., electrical contacts) 306. Each of the contact pads 306 of the substrate 302 may be associated with a distinct I/O, ground and/or power supply path. The package 304 may be a land grid array (LGA) package, a ball grid array (BGA) package, or any other package having multiple electrical contacts. The package 304 may include one or more integrated circuit components 308, such as microprocessor, a package substrate 309 and a plurality of contact pads (i.e., electrical contacts) 310. The package substrate 309 may be made of multiple layers of dielectric and/or ceramic material and one or more interconnects such as vias and/or traces. These interconnects may electrically couple the one or more integrated circuit components 308 to the contact pads 310.

For the embodiments, the interposer 100 may be aligned and placed on top of the substrate 302. For these embodiments, the conductive buttons 102 may each be aligned and placed on separate contact pads 306. By placing each of the conductive buttons 102 onto corresponding contact pads 306, each of the conductive buttons 102 may be in electrical contact with a corresponding contact pad 306. According to various embodiments, the conductive buttons 102 may be bonded or glued to the corresponding contact pads 306 using, for example, solder paste, conductive adhesive, reflow techniques and/or other methods of coupling conductive elements. In other embodiments, however, the conductive buttons 102 may be left unbonded or unglued to the contact pads 306. The carrier frame 106, which is linked to the conductive buttons 102, may assure that each of the conductive buttons 102 are aligned with a corresponding contact pad 306 of the substrate 302.

In various embodiments, the carrier frame 106 may be removed after the conductive buttons 102 have been placed on the contact pads 306. In other embodiments, however, the carrier frame 106 may be removed after the package 304 has been coupled to the substrate 302 via the conductive buttons 102. In yet other embodiments, the carrier frame 106 may be left attached to the conductive buttons 102 (to be discussed below). Various methods may be used to remove the carrier frame 106. For example, in one embodiment, the carrier frame 106 may be separated from the conductive buttons 102 by mechanically severing the conductive buttons 102 from the carrier frame 106. In such an embodiment, the severing of the conductive buttons 102 may occur at the necks 104. A mechanical device comprising of multiple blades may be employed for such purposes. The necks 104 may have features such as a cut feature or a tapered diameter portion, which may facilitate the clean separation of the conductive buttons from the carrier frame. If the carrier frame 106 is removed prior to the package 304 being coupled to the substrate 302 then a device may be used to hold the conductive buttons 102 in place (e.g., on the contact pads 306 of the substrate 302) while the carrier frame 106 is being removed.

Figure 4:
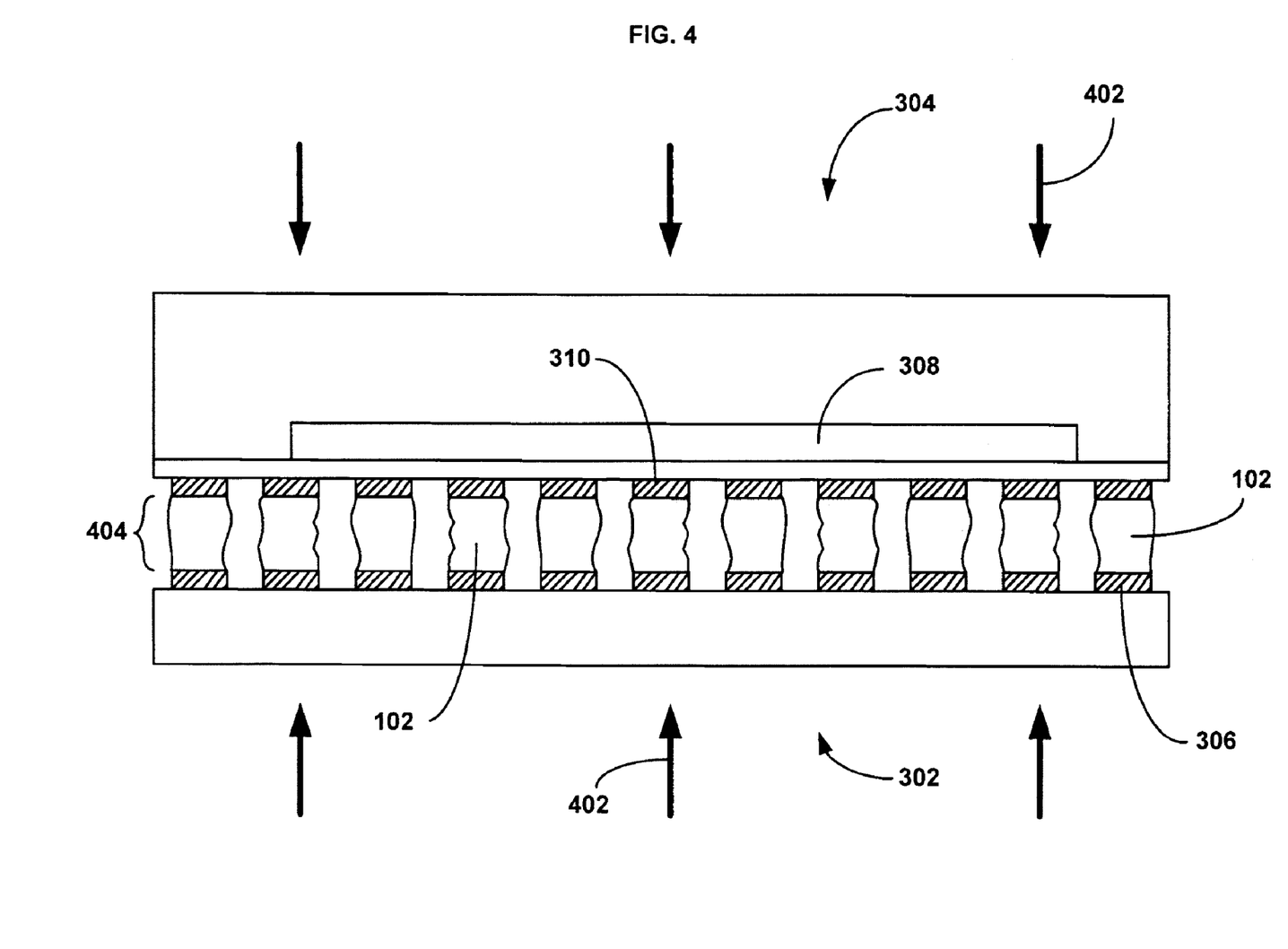
FIG. 4 illustrates a side view of the first and second multi-contact components of FIG. 3 electrically connected via conductive connectors according to some embodiments.

For the embodiments, once the conductive buttons 102 are seated onto the contact pads 306 (i.e., electrically connected), the microcircuit package 304 may be aligned over the conductive buttons 102 such that the contact pads 310 of the package 304 are aligned over the conductive buttons 102. The contact pads 310 of the package 304 along with the package 304 itself may then be placed on top of the conductive buttons 102 as depicted in FIG. 4.

In various embodiments, coupling force (or pressure) 402 may be applied to the package 304 and/or the substrate 302 in order to properly form good electrical contacts between the conductive buttons 102 and the contact pads 306 and 310 of the package 304 and the substrate 302. The coupling force 402 may be provided by various means including, for example, a clamp, a clip or other devices that provides similar functions. For these embodiments, the conductive buttons 102 may be made of conductive elastomer material. As a result of the elastic characteristic of the conductive buttons 102 and the coupling force 402 being applied to the package 304 and/or substrate 302, the conductive buttons 102 may form good electrical coupling with the contact pads 306 and 310 of both the package 304 and the substrate 302. Note that in FIG. 4, as a result of the coupling pressure 402, the elastic conductive buttons 102 are slightly compressed, cringed or warped (see ref. 404).

Although in the embodiments depicted above (as they relate to FIGS. 3 and 4) describe the conductive buttons 102 as being initially placed on top of the contact pads 306 of the substrate 302, in other embodiments, the conductive buttons 102 may instead be initially placed on top of the contact pads 310 of the a package 304. For these embodiments, similar processes for aligning and coupling the conductive buttons 102 and for removing the carrier frame 106 described above may be employed.

Figure 5:
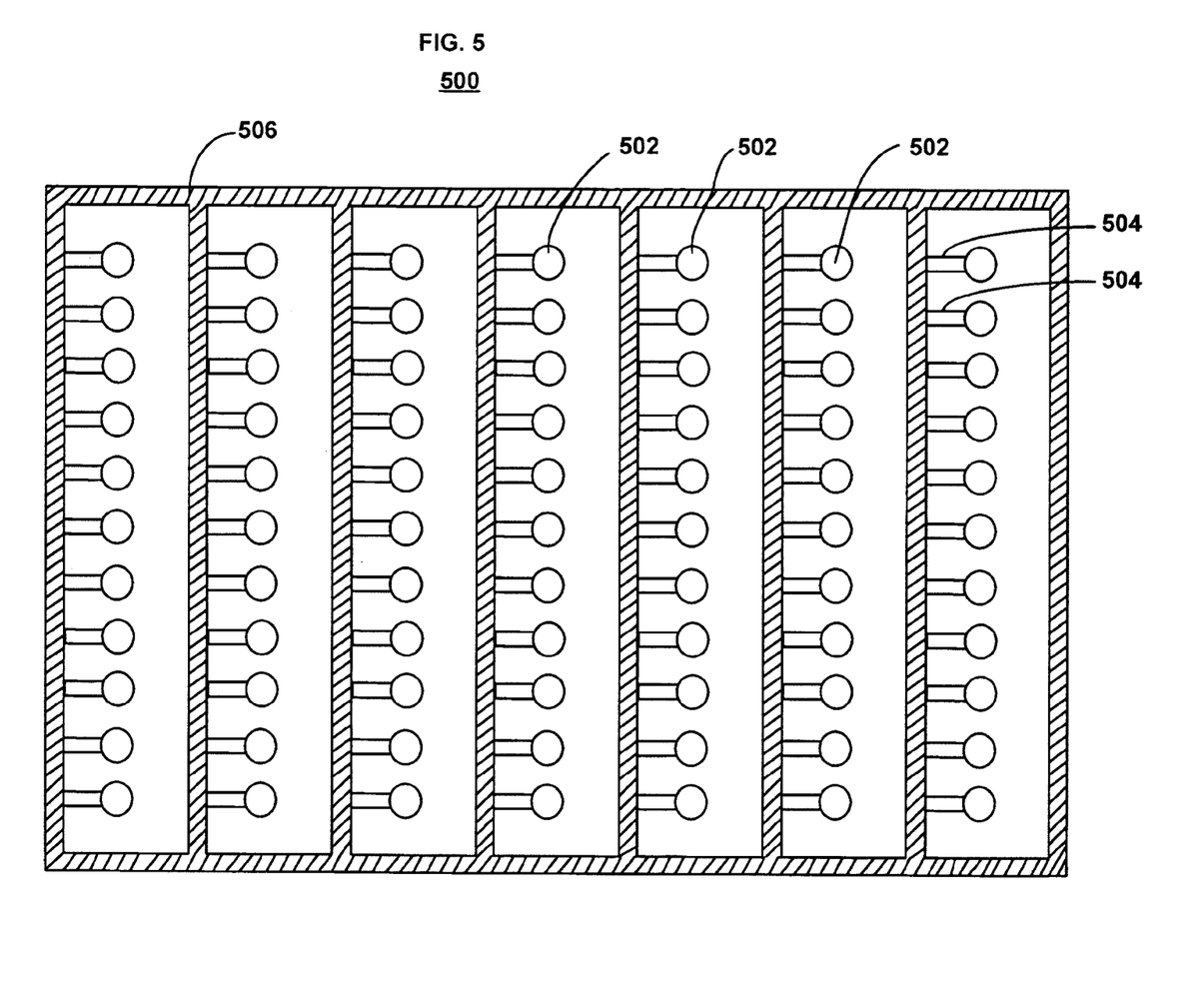
FIG. 5 illustrates a plan view of another interposer according to some embodiments.

FIG. 5 depicts an interposer 500 in accordance with some embodiments. For these embodiments, the interposer 500 as with the interposer 100 of FIG. 1 includes conductive buttons 502 that are attached to necks 504, and a carrier frame 506 attached to each of the necks 504. However, unlike the interposer 100 of FIG. 1, this interposer 500 is not entirely made of a conductive or a conductive elastomer material. That is, in various embodiments, such as the one depicted in FIG. 5, at least a portion of the carrier frame 506 may be made of non-conductive material in order to electrically isolate each of the conductive buttons 502. In the embodiment depicted in FIG. 5, the carrier frame 506 is entirely made of non-conductive material. As with the interposer 100 of FIG. 1, the interposer 500 may be used to electrically couple multi-contact components having multiple electrical contacts. However, because the carrier frame 506 is non-conductive, the carrier frame 506 may be left attached to the necks 504 even after the multi-contact components (e.g., a package and PCB substrate) have been coupled. Since the carrier frame 506 is non-conductive, each of the I/O, ground and/or power supply paths associated with each of the conductive buttons 502 may remain electrically isolated from the other I/O, ground and/or power supply paths without removing the carrier frame 506. In yet other alternative embodiments, the necks 504 may also be made of non-conductive materials. Unlike the embodiment depicted in FIG. 1, for these embodiments, the carrier frame 506 and the necks 504 may be as thick as the conductive buttons 502 so long as the conductive buttons 502 are able to still maintain good electrical contact with the contact pads of the package and/or substrate when the interposer 500 is deployed. For example, in one embodiment, the carrier frame 506 and/or the necks 504 may be thicker than the conductive buttons 502 if the contact pads of the package and/or substrate have sufficient thickness or height to compensate for the additional thickness of the carrier frame 506 and/or the necks 504.

Figure 6:
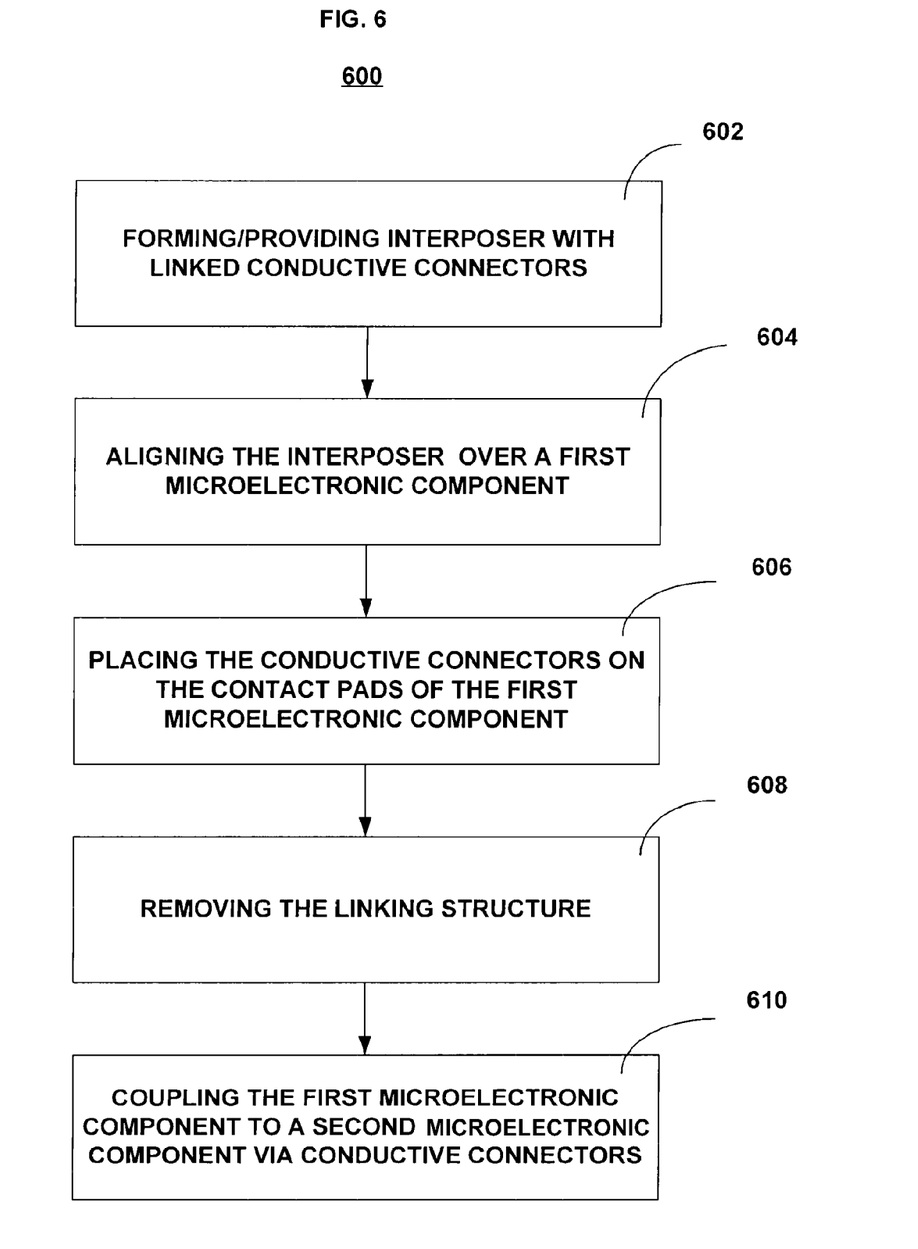
FIG. 6 illustrates a process for providing conductive connectors between two multi-contact components according to some embodiments.

FIG. 6 depicts a process for placing conductive connectors (e.g., conductive buttons) between a first multi-contact component and a second multi-contact component in accordance with various embodiments. For the embodiments, the process 600 may begin when an interposer with conductive connectors that are linked together are formed or provided at block 602. The interposer may include a plurality of conductive connectors that may be made of a conductive elastomer material and linked together by a carrier frame. The carrier frame may have sufficient structural integrity to assure that each of the conductive connectors is substantially stationary relative to the other conductive connectors.

Once the interposer is formed or provided, the interposer may be aligned over a first multi-contact component (e.g., a package or a PCB substrate) at block 604 in accordance with some embodiments. The interposer may be aligned with the multi-contact component such that each of the conductive connectors of the interposer is aligned on top of each of the electrical contacts of the first multi-contact component. In other embodiments, the interposer may be simultaneously aligned between the first and a second multi-contact component.

After aligning the conductive connectors over the electrical contacts, the conductive connectors may be placed on top of the electrical contacts according to various embodiments. For the embodiments, the conductive connectors may be bonded or glued onto the electrical contacts at block 606. In other embodiments, the conductive connectors may be simply placed onto the electrical contacts without any bonding or adhesive material.

After bonding or placing the conductive connectors onto the electrical contacts on the first multi-contact component, the carrier frame may be removed according to some embodiments at block 608. In other embodiments, the carrier frame may be removed after other processes have been performed. In still other embodiments, the carrier frame may be left attached to the conductive connectors if, for example, the carrier frame is partially or fully made of non-conductive material.

Finally the first multi-contact component is electrically coupled to a second multi-contact component by coupling the conductive connectors to the second multi-contact component according to some embodiments at block 610. For these embodiments, the conductive connectors may be aligned and put in contact with the electrical contacts of the second multi-contact component such that each of the conductive connectors are electrically coupled to each pair of corresponding electrical contacts of the first and second multi-contact components.

Note that the blocks 602 to 610 illustrated in FIG. 6 may be modified or in a different sequential order than the one depicted in various other embodiments. Further, in some embodiments, one or more of the blocks 602 to 610 may be eliminated from the overall process 600. Yet further, in some embodiments, other block or blocks of operation may be added.

Figure 7:
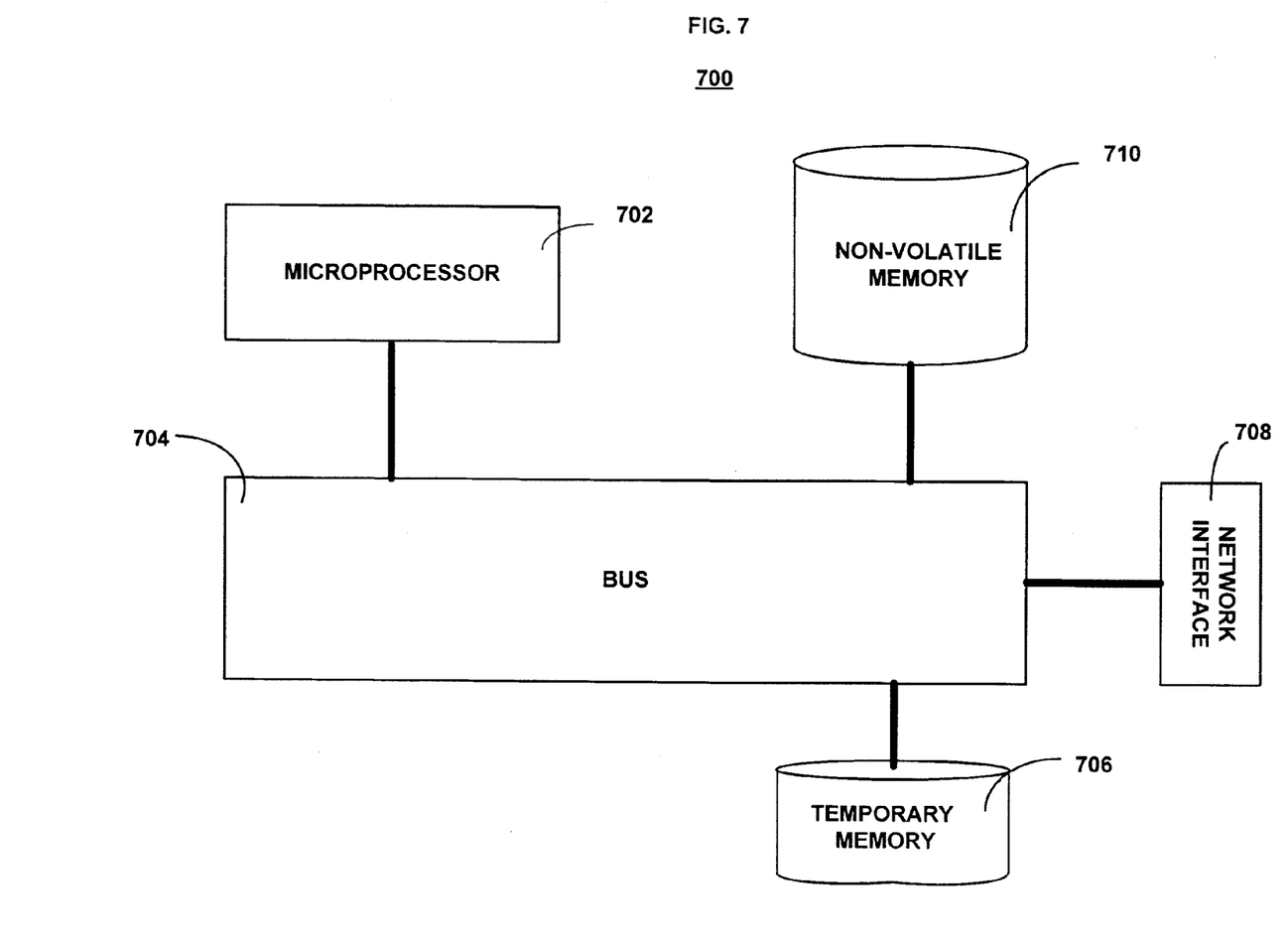
FIG. 7 is a block diagram of an example system, according to some embodiments.

Referring now to FIG. 7, where a system 700 in accordance with some embodiments is shown. The system 700 includes a microprocessor 702 that may be coupled to a bus 704. The system 700 may further include temporary memory 706, a network interface 708, and an optional non-volatile memory 710. One or more of the above enumerated elements, such as microprocessor 702, temporary memory 706, non-volatile memory 710, and so forth, may be part of a integrated circuit package that includes the novel conductive elastomer connectors formed using substantially the novel composition and process described above.

Depending on the applications, the system 700 may include other components, including but not limited to chipsets, RF transceivers, mass storage (such as hard disk, compact disk (CD), digital versatile disk (DVD), graphical or mathematic co-processors, and so forth.

One or more of the system components may be located on a single chip such as a SOC. In various embodiments, the system 700 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An apparatus, comprising:
   a first multi-contact component having a first plurality of electrical contacts;
   a second multi-contact component having a second plurality of electrical contacts;
   a carrier frame having a plurality of interposer conductive connectors coupled to the first and second plurality of electrical contacts; and
   a plurality of breakaway portions attached to the plurality of interposer conductive connectors respectively, to facilitate separation of the plurality of interposer conductive connectors from the carrier frame, wherein the plurality of breakaway portions have lower material strength and smaller diameter than those of the carrier frame and interposer conductive connectors respectively.

2. The apparatus of claim 1, wherein the plurality of interposer conductive connectors comprises conductive elastomer connectors.

3. The apparatus of claim 1, wherein the first multi-contact component is a component selected from the group consisting of a land grid array package, a ball grid array package and a printed circuit board substrate.

4. The apparatus of claim 1, wherein the plurality of interposer conductive connectors are bonded to the first plurality of electrical contacts.

5. The apparatus of claim 1, wherein the plurality of interposer conductive connectors are linked together.

6. The apparatus of claim 5, wherein the plurality of interposer conductive connectors are linked together by the carrier frame that is non-conductive.

7. The apparatus of claim 1, wherein each of the plurality of breakaway portions has a tapered diameter.

8. The apparatus of claim 1, wherein the plurality of breakaway portions is non-conductive.

* * * * *